United States Patent
Badar et al.

(10) Patent No.: US 12,490,643 B2
(45) Date of Patent: Dec. 2, 2025

(54) OLED DISPLAY DEVICE FOR VEHICLE INTERIOR SYSTEMS

(71) Applicant: Corning Incorporated, Corning, NY (US)

(72) Inventors: Amey Ganpat Badar, Corning, NY (US); Kaikai Che, Corning, NY (US); Khaled Layouni, Fontainebleau (FR); Jong Se Park, San Jose, CA (US); Yousef Kayed Qaroush, Painted Post, NY (US)

(73) Assignee: CORNING INCORPORATED, Corning, NY (US)

( * ) Notice: Subject to any disclaimer, the term of this patent is extended or adjusted under 35 U.S.C. 154(b) by 501 days.

(21) Appl. No.: 17/924,300

(22) PCT Filed: May 6, 2021

(86) PCT No.: PCT/US2021/031085
§ 371 (c)(1),
(2) Date: Nov. 9, 2022

(87) PCT Pub. No.: WO2021/231172
PCT Pub. Date: Nov. 18, 2021

(65) Prior Publication Data
US 2023/0200199 A1    Jun. 22, 2023

Related U.S. Application Data

(60) Provisional application No. 63/025,503, filed on May 15, 2020.

(51) Int. Cl.
*H10K 77/10*    (2023.01)
*B60K 35/22*    (2024.01)
(Continued)

(52) U.S. Cl.
CPC ............ *H10K 77/111* (2023.02); *B60K 35/22* (2024.01); *B60K 35/60* (2024.01);
(Continued)

(58) Field of Classification Search
CPC ................. H10K 77/111; H10K 71/50; H10K 2102/311; H10K 2102/351;
(Continued)

(56) References Cited

U.S. PATENT DOCUMENTS

| | | | |
|---|---|---|---|
| 2014/0231793 A1* | 8/2014 | Rajan | H01R 12/61 257/40 |
| 2018/0188869 A1* | 7/2018 | Boggs | B60K 35/50 |
| 2019/0012032 A1* | 1/2019 | Brandao Salgado | G06F 3/041 |

FOREIGN PATENT DOCUMENTS

| | | |
|---|---|---|
| TW | M478636 U | 5/2014 |
| WO | 2019/055667 A1 | 3/2019 |

OTHER PUBLICATIONS

Taiwanese Patent Application No. 110117389, Office Action dated Feb. 10, 2025, 2 pages (English Translation only), Taiwanese Patent Office.

(Continued)

*Primary Examiner* — J. E. Schoenholtz
(74) *Attorney, Agent, or Firm* — Daniel J. Greenhalgh

(57) ABSTRACT

Disclosed is a display device for a vehicle interior system. The display device includes a display module having a glass substrate, an organic light emitting diode (OLED) display, and a support member. The glass substrate has a first major surface and a second major surface opposite to the first major surface. The OLED display is disposed on the second major surface of the glass substrate, and the support member includes a first support surface and a second support surface opposite to the first support surface. The OLED display is disposed on the first support surface. The display device also (Continued)

includes a mounting element disposed on the second support surface of the support member. The support member and the mounting element have respective first and second stiffnesses. The first stiffness is at least 100 N/mm, and an effective stiffness of the first and stiffnesses is no more than 270 N/mm.

20 Claims, 7 Drawing Sheets

(51) Int. Cl.
    *B60K 35/50*     (2024.01)
    *B60K 35/60*     (2024.01)
    *B60K 37/20*     (2024.01)
    *B60R 11/00*     (2006.01)
    *B60R 11/02*     (2006.01)
    *H05K 5/02*     (2006.01)
    *H10K 71/50*     (2023.01)
    *H10K 102/00*     (2023.01)

(52) U.S. Cl.
    CPC ............ B60R 11/0235 (2013.01); H05K 5/02 (2013.01); H10K 71/50 (2023.02); *B60K 35/50* (2024.01); *B60K 37/20* (2024.01); *B60R 2011/0003* (2013.01); *H10K 2102/311* (2023.02); *H10K 2102/351* (2023.02)

(58) Field of Classification Search
    CPC ........ B60R 11/0235; B60R 2011/0003; H05K 5/02; B60K 35/60; B60K 35/50; B60K 37/20; B60K 2360/332; B60K 2360/816; B60K 2360/92; B60K 2360/96; B60K 35/211; B60K 2360/1523; B60K 35/22; B60K 35/00; B60K 2360/652; B60Y 2400/92
    See application file for complete search history.

(56) References Cited

OTHER PUBLICATIONS

International Search Report and Written Opinion of the International Searching Authority; PCT/US2021/031085; dated Jul. 27, 2019; 10 pages; European Patent Office.

\* cited by examiner

OLED DISPLAY DEVICE FOR VEHICLE INTERIOR SYSTEMS

CROSS-REFERENCE TO RELATED APPLICATIONS

This application claims the benefit of priority under 35 U.S.C. § 371 of International Application No. PCT/US2021/031085, filed on May 6, 2021, which claims the benefit of priority under 35 U.S.C. § 119 of U.S. Provisional Application Ser. No. 63/025,503 filed on May 15, 2020, the content of which are relied upon and incorporated herein by reference in their entirety.

BACKGROUND

The disclosure relates to display devices for vehicle interior systems and, more particularly, to organic light emitting diode (OLED) display devices configured to meet headform impact testing requirements.

Vehicle interiors include curved surfaces and can incorporate displays in such curved surfaces. The materials used to form such curved surfaces are typically limited to polymers, which do not exhibit the durability and optical performance as glass. As such, curved glass substrates are desirable, especially when used as covers for displays. Existing methods of forming such curved glass substrates, such as thermal forming, have drawbacks including high cost, optical distortion, and surface marking. Accordingly, Applicant has identified a need for vehicle interior systems that can incorporate a curved glass substrate in a cost-effective manner and without problems typically associated with glass thermal forming processes.

SUMMARY

According to an aspect, embodiments of the disclosure relate to a display device for a vehicle interior system. The display device includes a display module having a glass substrate, an organic light emitting diode (OLED) display, and a support member. The glass substrate has a first major surface and a second major surface. The second major surface is opposite to the first major surface. The OLED display is disposed on the second major surface of the glass substrate, and the support member includes a first support surface and a second support surface. The second support surface is opposite to the first support surface. The OLED display is disposed on the first support surface. The display device also includes a mounting element disposed on the second support surface of the support member. The support member has a first stiffness and the mounting element has a second stiffness. The first stiffness is at least 100 N/mm, and an effective stiffness of the first stiffness and the second stiffness is no more than 270 N/mm.

According to another aspect, embodiments of the disclosure relate to a display device for a vehicle interior system. The display device includes a display module having a flexural rigidity of 10 Nm to 500 Nm. The display module includes a glass substrate, an OLED display, and a support member. The glass substrate has a first major surface and a second major surface. The second major surface is opposite to the first major surface. The OLED display is disposed on the second major surface of the glass substrate. The support member has a first support surface and a second support surface. The second support surface is opposite to the first support surface. The OLED display is disposed on the first support surface. A mounting element is disposed on the second support surface of the support member. When the display device is subjected to headform impact testing according to FMVSS 201, the headform does not exceed 80 g deceleration continuously for more than 3 ms.

According to still another aspect, embodiments of the disclosure relate to a method of manufacturing a display device. In the method, an OLED display is adhered to a first support surface of a support member. A mounting element is attached to a second support surface of the support member. The second support surface is opposite to the first support surface. The OLED display is adhered to a glass substrate such that the OLED display is disposed between the glass substrate and the support member. The support member and the mounting element comprises an effective stiffness ($K_S$) of 270 N/mm or less.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification.

BRIEF DESCRIPTION OF THE DRAWINGS

The accompanying drawings incorporated in and forming a part of the specification illustrate several aspects of the present invention and, together with the description, serve to explain the principles of the invention. In the drawings.

DETAILED DESCRIPTION

Reference will now be made in detail to various embodiments, examples of which are illustrated in the accompanying drawings. In general, the various embodiments pertain to vehicle interior systems having an organic light emitting diode (OLED) display module with a mounting structure configured to meet frangibility requirements related to headform impact testing. As compared to conventional liquid crystal displays (LCD) or backlit LED displays, OLED displays are much thinner and do not require a backlight unit. As such, the stiffness of an OLED display is much lower than that of an LCD or backlit LED display. Accordingly, OLED displays cannot be used with conventional mounting structures in vehicle interior systems and still meet relevant requirements for headform impact testing. Thus, embodiments of a display module and mounting structure disclosed herein provide the requisite stiffness to meet relevant standards for headform impact testing. The embodiments described herein are provided by way of illustration and not by way of limitation.

In general, a vehicle interior system may include a variety of different curved surfaces that are designed to be transparent, such as curved display surfaces. Forming curved vehicle surfaces from a glass material provides a number of advantages compared to the typical curved plastic panels that are conventionally found in vehicle interiors. For example, glass is typically considered to provide enhanced functionality and user experience in many curved cover material applications, such as display applications and touch screen applications, compared to plastic cover materials.

Figure 1:
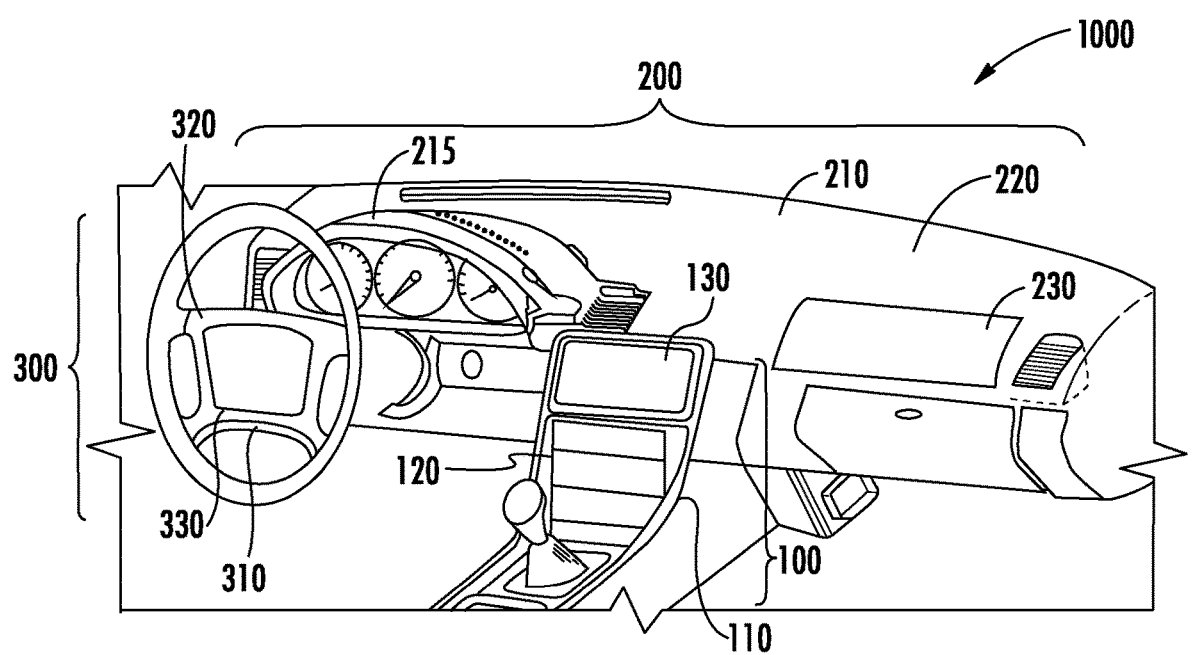
FIG. 1 is a perspective view of a vehicle interior with vehicle interior systems having OLED display modules, according to exemplary embodiments.

FIG. 1 shows an exemplary vehicle interior 1000 that includes three different embodiments of a vehicle interior system 100, 200, 300. Vehicle interior system 100 includes a frame, shown as center console base 110, with a curved surface 120 including an OLED display 130. Vehicle interior system 200 includes a frame, shown as dashboard base 210, with a curved surface 220 including an OLED display 230. The dashboard base 210 typically includes an instrument panel 215 which may also include an OLED display. Vehicle interior system 300 includes a frame, shown as steering wheel base 310, with a curved surface 320 and an OLED display 330. In one or more embodiments, the vehicle interior system includes a frame that is an arm rest, a pillar, a seat back, a floor board, a headrest, a door panel, or any portion of the interior of a vehicle that includes a curved surface. In other embodiments, the frame is a portion of a housing for a free-standing display (i.e., a display that is not permanently connected to a portion of the vehicle).

The embodiments of the OLED display device described herein can be used in each of vehicle interior systems 100, 200 and 300, among others. In some such embodiments, the OLED display device discussed herein may include a cover glass substrate that also cover non-display surfaces for the dashboard, center console, door panel, etc. In such embodiments, glass material may be selected based on its weight, aesthetic appearance, etc. and may be provided with a coating (e.g., an ink or pigment coating) with a pattern (e.g., a brushed metal appearance, a wood grain appearance, a leather appearance, a colored appearance, etc.) to visually match the glass components with adjacent non-glass components. In specific embodiments, such ink or pigment coating may have a transparency level that provides for deadfront or color matching functionality when the OLED display is inactive.

Figure 2A:
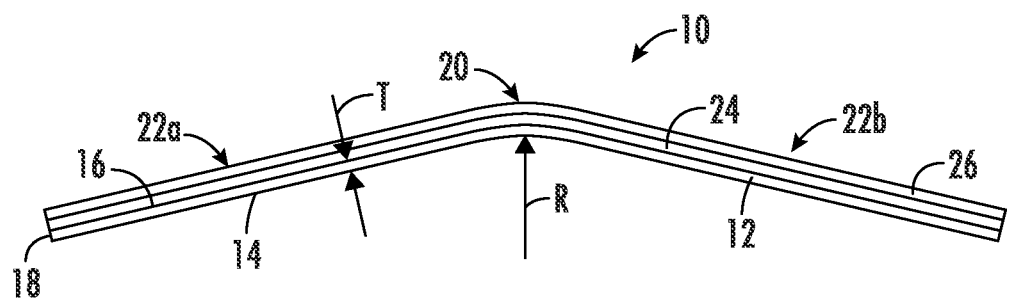
FIG. 2A depicts a side view of a V-shaped display module, according to an exemplary embodiment.
Figure 2B:
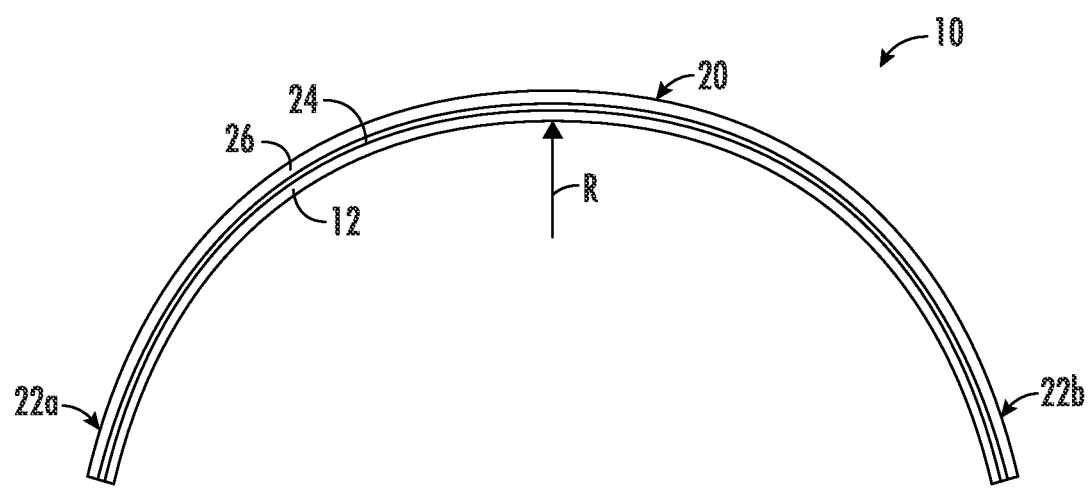
FIG. 2B depicts a side view of a C-shaped display module, according to an exemplary embodiment.

In embodiments, the curved surfaces 120, 220, 320 can be any of a variety of curved shaped, such as V-shaped or C-shaped as shown in FIGS. 2A and 2B, respectively. Referring first to FIG. 2A, a side view of an embodiment of a V-shaped OLED display module 10 is shown. The V-shaped OLED display module 10 includes a glass substrate 12 having a first major surface 14, a second major surface 16 opposite to the first major surface 14, and a minor surface 18 joining the first major surface 14 to the second major surface 16. The first major surface 14 and the second major surface 16 define a thickness T of the glass substrate 12. In embodiments, the thickness T of the glass substrate 12 is from 0.3 mm to 2 mm, in particular 0.5 mm to 1.1 mm. In a vehicle, the first major surface 14 faces the occupants of the vehicle.

In embodiments, the first major surface 14 and/or the second major surface 16 includes one or more surface treatment. Examples of surface treatments that may be applied to one or both of the first major surface 14 and second major surface 16 include an anti-glare coating, an anti-reflective coating, a coating providing touch functionality, a decorative (e.g., ink or pigment coating), and an easy-to-clean coating.

As can be seen in FIG. 2A, the glass substrate 12 has a curved region 20 disposed between a first flat section 22a and a second flat section 22b. In embodiments, the curved region 20 has a radius of curvature R that is from 50 mm to a radius of curvature that is less than substantially flat or planar (e.g., R=10 m). In general, a tighter radius of curvature is easier to achieve at a relatively thinner glass thickness. Further, as shown in FIG. 2A, the curved region 20 defines a concave curve, but in other embodiments, the curved region 20 is instead a convex curve. For the V-shaped OLED display module 10 of FIG. 2A, an OLED display 24 is bonded to the second major surface 16 in the curved region 20 using, e.g., an optically clear adhesive or a pressure sensitive adhesive. In embodiments, the OLED display 24 has a thickness of 2 mm or less, in particular 1 mm or less, and more particularly 0.5 mm or less. Further, a support member 26 is bonded to the OLED display 24 such that the OLED display 24 is disposed between the glass substrate 12 and the support member 26. As will be discussed more fully below, the support member 26, in part, provides the OLED display module 10 with the flexural rigidity necessary to meet the requirements of headform impact testing.

FIG. 2B depicts a C-shaped OLED display module 10. As compared to the V-shaped OLED display module 10 of FIG. 2A, the C-shaped OLED display module 10 of FIG. 2B has a larger curved region 20 and shorter flat sections 22a, 22b. The V-shape and C-shape are but two examples of curved display modules that can be created according to the present disclosure. In other embodiments, the display modules can include curved regions 20 having opposing curvatures to create an S-shape, a curved region 20 followed by a flat section 22a to create a J-shape, and curved regions 20 separated by a flat section 22a to create a U-shape, among others.

Advantages of the OLED display module 10 include its relative thinness as compared to convention LCD and backlit LED displays and the flexibility of the OLED display to conform to curvatures having a tight bend radius. However, the thinness and flexibility also lead to a decrease in stiffness and flexural rigidity when paired with conventional frames and mounting elements. A comparison of FIGS. 3A-3B with FIGS. 4A-4B demonstrate the significant difference in flexural rigidity for a conventional LCD module and the presently disclosed OLED display module 10.

Figure 3A:
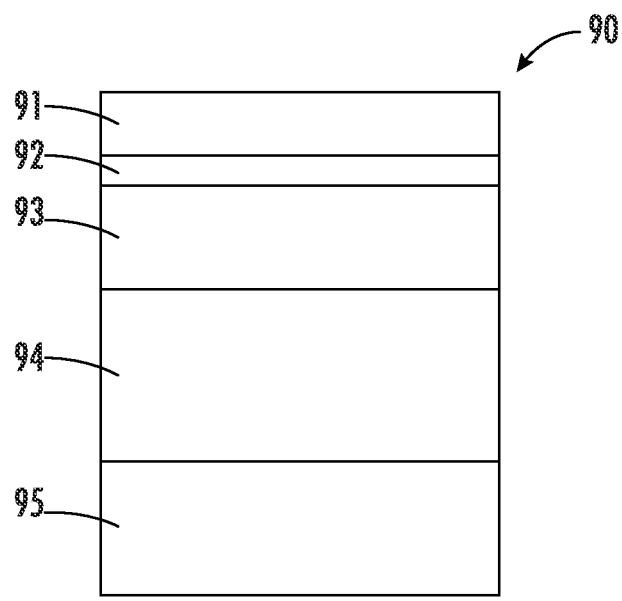
FIGS. 3A and 3B depict an LCD module and graph of the flexural rigidity broken down by component for the LCD module, respectively.

FIG. 3A depicts a conventional LCD module 90 consisting of a glass substrate 91, an optically clear adhesive layer 92, an LCD 93, a backlight unit 94, and a support member 95. For such an LCD module 90, the glass substrate 91 may have a thickness of, e.g., 0.55 mm to 2.0 mm. The optically clear adhesive 92 may have a thickness of 1 mm or less. The LCD 93 consists of a stack of several component layers that is several millimeters (e.g., about 2 mm to 20 mm) thick. Further, the backlight unit 94 is also several millimeters (e.g. about 2 mm to 20 mm) thick, and the support member 95 is about 3 mm thick. Because a significant portion of the LCD module 90 thickness is attributable to the LCD 93 and the backlight unit 94, these components contribute significantly to the flexural rigidity of the LCD module 90 as shown in FIG. 3B.

Figure 3B:
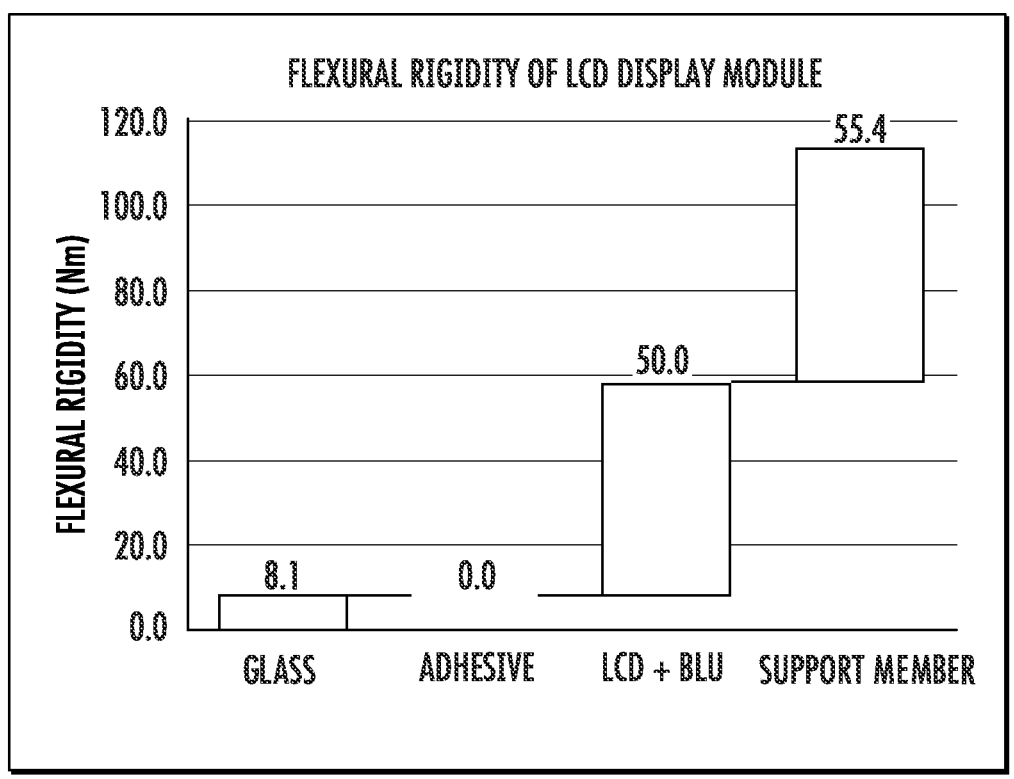

FIG. 3B considers an LCD module 90 having a flexural rigidity of about 114 Nm. Flexural rigidity can be determined according to Equation 1, below:

$$D = \frac{ET^3}{12(1-v^2)}$$

in which D is the flexural rigidity, E is the Young's modulus of the material, T is the thickness, and v is Poisson's Ratio of the material.

The glass substrate 91, having a thickness of 1.1 mm, contributes 8.1 Nm to the flexural rigidity, and the remaining flexural rigidity is substantially split between the LCD 93 and backlight unit 94 and the support member 95 having a thickness of 2.8 mm. As will be shown, the much thinner OLED display 24 does not need a backlight unit and contributes much less to the flexural rigidity of the OLED display module 10.

Figure 4A:
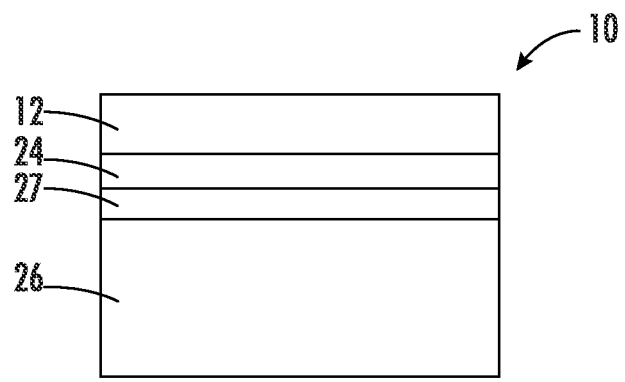
FIGS. 4A and 4B depict an OLED display module and a graph of the flexural rigidity broken down by component for the OLED display module, according to an exemplary embodiment.

In that regard, FIG. 4A depicts an exemplary embodiment of an OLED display module 10. In embodiments, the OLED display module 10 is configured to have a flexural rigidity in the range of 10 Nm to 500 Nm. In a particular embodiment, the flexural rigidity of the OLED display module 10 is in the range of 100 Nm to 120 Nm. As shown in FIG. 4A, the OLED display module includes a glass substrate 12 as a cover material, an OLED display 24 adhered to the glass substrate 12 (e.g., using an optically clear adhesive or a pressure sensitive adhesive), a support member 26, and an adhesive layer 27 (e.g., structural adhesive layer) bonding the OLED display 24 and/or the glass substrate 12 (e.g., in areas around the OLED display 24) to the support member 26. In the embodiment considered, the glass substrate 12 had a thickness of 1.1 mm. The OLED display 24 had a thickness of 0.36 mm, consisting, e.g., of layers of polyimide and organic, light emitting coatings, and the adhesive layer 27 had a thickness of less than 1.0 mm. In order to achieve the same flexural rigidity (about 114 Nm) of the LCD module 90 of FIG. 3A, the support member 26 had a thickness of about 4 mm.

Figure 4B:
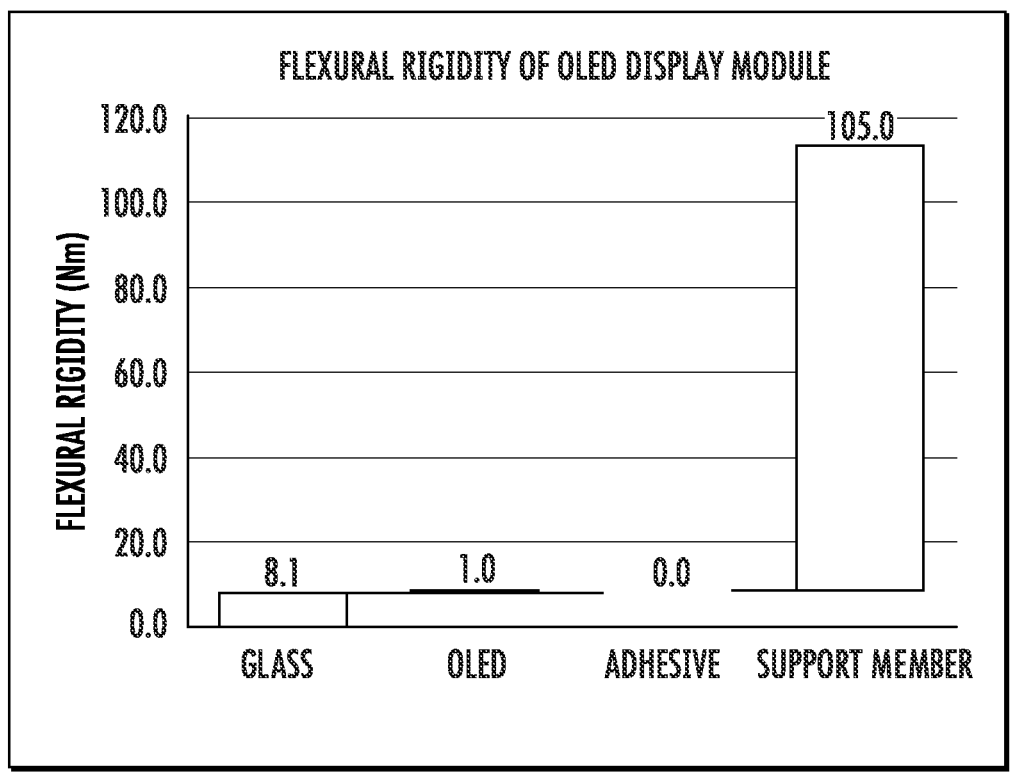

As can be seen in FIG. 4B, the support member 26 contributes 105 Nm (e.g., at least 80%, in particular at least 90%) of flexural rigidity to the display module 10. The glass substrate 12 contributes 8.1 Nm of flexural rigidity (e.g., 20% or less, in particular 10% or less), and on account of the thinness and lack of backlight unit, the OLED display 24 contributes only about 1.0 Nm to the flexural rigidity (5% or less, in particular 2% or less).

In order to meet the requirements of headform impact testing, the OLED display module 10 needs to have a flexural rigidity low enough to decelerate a headform in a manner that prevents 80 g of force continuously for more than 3 ms while being high enough to prevent flexing to a degree that would cause the glass substrate 12 to break. In this regard, flexural rigidity is related to the stiffness, and the stiffness of the OLED display module 10 can be varied by varying the material properties and/or the geometry of the support member 26 and, as discussed below, a mounting element that joins the OLED display module 10 to a vehicle interior base.

The formula relating flexural rigidity to stiffness is given by Equation 2, below:

$$K = \frac{48Dw(1-v^2)}{l^3}$$

in which K is the stiffness, D is the flexural rigidity, w is the width of the display module, l is the length of the display module, and v is Poisson's Ratio. From Equation 1 and Equation 2, it can be seen that the geometry (i.e., particular selection of the width w, length 1, and thickness T) and material properties (i.e., Young's modulus and Poisson's Ratio) of the OLED display module 10 has a substantial effect on the flexural rigidity and stiffness. In general the width and length will be dictated by the particular application and customer specifications, leaving the thickness ($D \propto T^3$) and material properties (Young's modulus E and Poisson's Ratio v) as likely variables to manipulate to achieve the desired stiffness and flexural rigidity.

Figure 5A:
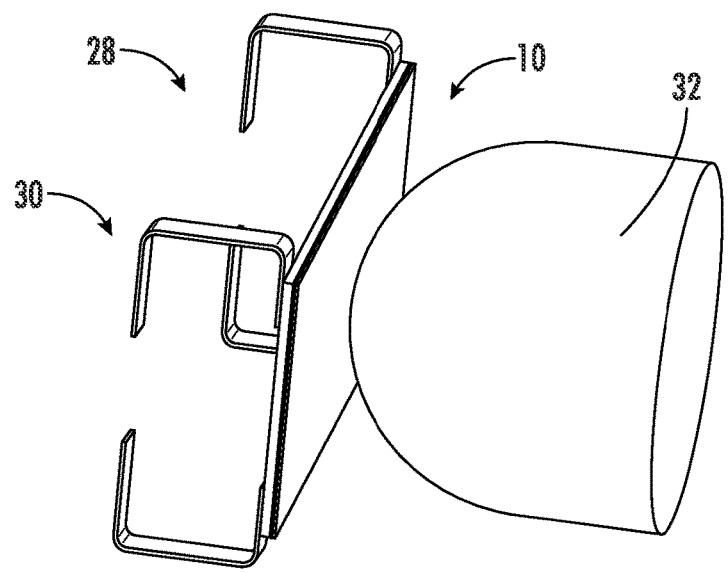
FIG. 5A depicts an OLED display device undergoing headform impact testing, according to an exemplary embodiment.

FIG. 5A depicts an embodiment of a display device 28 including a display module 10 and a mounting element 30. FIG. 5A also depicts a headform 32 such as would be used to perform headform impact testing. The display device 28 is configured to meet the requirements according to headform impact testing (North America: FMVSS 201; European Union: ECE R21; China: GB 11552 2009). In particular, display device 28 has an effective stiffness ($K_S$) imparted by the display module 10 and the mounting element 30 that is sufficient to meet the requirements of headform impact testing.

Because a substantial portion of the stiffness of the OLED display module 10 is imparted by the support member 26, reference will be made to a first stiffness ($K_1$) of the support member 26 in the following discussion. In this regard, the support member 26 provides several customizable aspects by which to manipulate the stiffness of the OLED display module 10. Additionally, in the following discussion, reference to the effective stiffness $K_S$ is also based on the first stiffness $K_1$ of the support member 26 and on a second stiffness $K_2$ of the mounting element 30. The first and second stiffnesses $K_1$ and $K_2$ define the effective stiffness $K_S$ for the display device 28 according to Equation 3, below:

$$K_S = \frac{K_2 K_1}{K_2 + K_1}$$

In this way, the dynamic response of OLED display device 28 is related to the stiffness $K_1$ of the support member and the stiffness $K_1$ of the mounting element 30. As such, the effective stiffness $K_S$ can be manipulated by varying the geometry and/or material properties of the support member 26 of the display module 10 and/or of the mounting element 30. In the embodiment depicted in FIG. 5B, the support member 26 is an aluminum backing plate. For a backing plate of a given aluminum alloy, the stiffness can be varied according to Equations 1 and 2 by, e.g., varying the thickness of the backing plate. In particular, increasing the thickness will increase the stiffness. Further, for a given backing plate thickness, the stiffness can be varied by, e.g., varying the material from which it is made. In particular, the stiffness of the support member 26 will increase as the elastic modulus of the material from which it is made increases (e.g., the stiffness will be higher for a steel support member 26 than for an aluminum support member 26 having the same geometry).

Figure 5B:
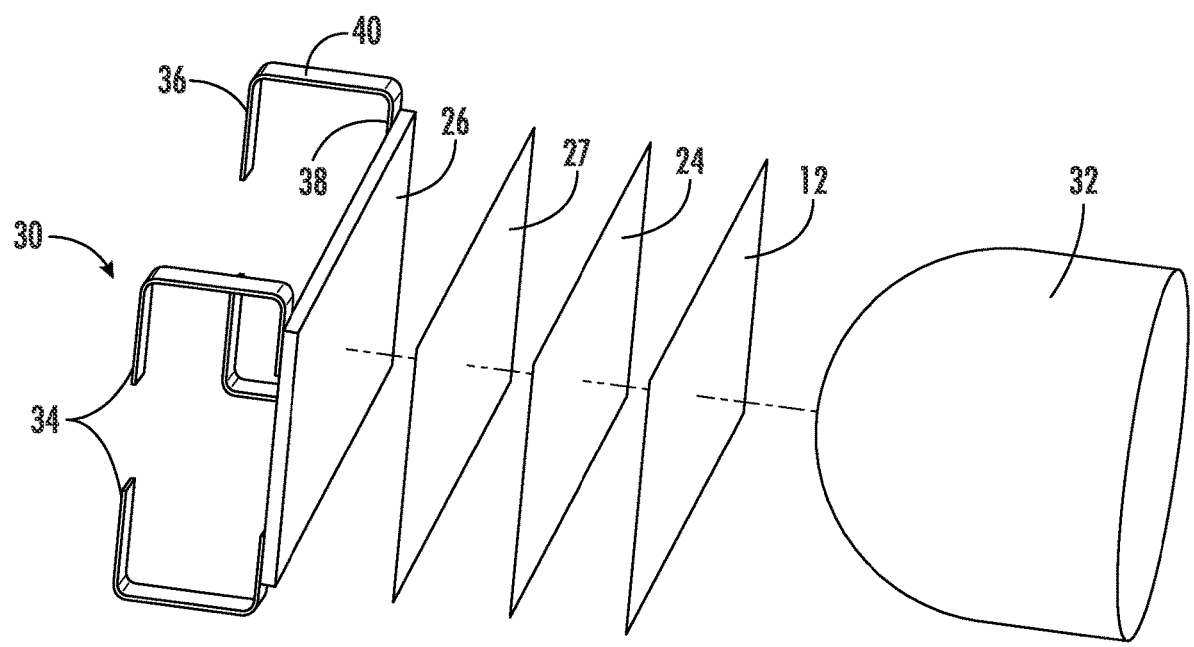
FIG. 5B depicts an exploded view of the OLED display device of FIG. 5A, according to exemplary embodiments.

Similarly, the stiffness $K_2$ of the mounting element 30 can be varied by varying the geometry and/or mechanical properties of the mounting element 30. In the embodiment shown in FIG. 5B, the mounting element 30 is a plurality, in particular four, mounting brackets 34. Each mounting bracket 34 in the embodiment of FIG. 5B is U-shaped having a first arm 36, a second arm 38, and a cross-member 40 joining the first arm 36 and the second arm 38. The second arm 38 is secured (fastened, welded, adhered, interlocked, fitted, etc.) to the rear surface of the support member 26, and the first arm 36 is configured for attachment to a vehicle interior base (e.g., center console base 110, dashboard base 210, or steering wheel base 310 of FIG. 1). In such an embodiment, the stiffness $K_2$ of the mounting element 30 can be adjusted by varying the thickness of the arms 36, 38 and cross-member 40, by varying the material (i.e., elastic modulus) of the brackets 34, the number of brackets 34, the position of the brackets 34, or the shape of the brackets 34. In other embodiments, the mounting element 30 can be any of a variety of other suitable structures and be made of any of a variety of metal alloys, plastics, composite materials, or a combination of one or more thereof.

Ultimately, the particular shape and material of the support member 26 and mounting element 30 are not limited but instead are designed to provide an effective stiffness $K_S$ as described below. For the sake of illustration, Table 1 provides examples of an OLED display module 10 having an aluminum backing plate support member 26 (E=68 GPa; v=0.33; density=2.7 g/cm$^3$) and steel brackets 34 (E=205 GPa; v=0.29; density=7.85 g/cm$^3$) as a mounting element 30. The thickness of the respective backing plate and brackets were varied to achieve various stiffnesses $K_1$ and $K_2$ as shown in Table 1.

TABLE 1

Example Support Member and Mounting Element Stiffnesses

| Aluminum Backing Plate | Thickness (mm) | 4.2 | 6.19 | 725 | 9.42 |
|---|---|---|---|---|---|
| | $K_1$ (N/mm) | 100 | 300 | 500 | 1000 |
| Steel Brackets | Thickness (mm) | 1.778 | 2.286 | 3.175 | 4.826 |
| | $K_2$ (N/mm) | 368 | 696 | 1100 | 4152 |

Using the stiffness values $K_1$ and $K_2$ for the support member 26 and the mounting element 30, an explicit dynamic finite element model was developed to study the dynamic response of OLED display under headform impact testing (HIT) according to FMVSS 201. The numerical simulation results are shown in Table 2 and Table 3 for the deceleration of the headform 32 and for the maximum principal stress on the cover glass 12, respectively. The italicized data points are stiffness combinations that fail the HIT regulation because the headform 32 experienced a deceleration of more than 80 g for longer than a 3 ms duration.

TABLE 2

Deceleration (g) for Various Support Member and Mounting Element Stiffnesses

| | | $K_2$ (N/mm) | | | |
|---|---|---|---|---|---|
| | | 368 | 696 | 1100 | 4152 |
| $K_1$ (N/mm) | 1000 | 98.7 | 90 | 105 | *182* |
| | 500 | 80 | 62 | *109* | *133* |
| | 300 | 66 | 59 | *97* | *104* |
| | 100 | 42 | 54 | 64 | 68 |

TABLE 3

Peak Stress on Glass Substrate for Various Support Member and Mounting Element Stiffnesses

| | | $K_2$ (N/mm) | | | |
|---|---|---|---|---|---|
| | | 368 | 696 | 1100 | 4152 |
| $K_1$ (N/mm) | 1000 | 669 | 731 | 732 | 730 |
| | 500 | 730 | 731 | 731 | 732 |
| | 300 | 720 | 721 | 721 | 726 |
| | 100 | 708 | 707 | 706 | 705 |

As can be seen from Table 3, all of the glass substrates 12 experienced a maximum principal stress of less than 900 MPa, which corresponds to the breakage point for the particular glass used in the numerical modeling.

Figure 6:
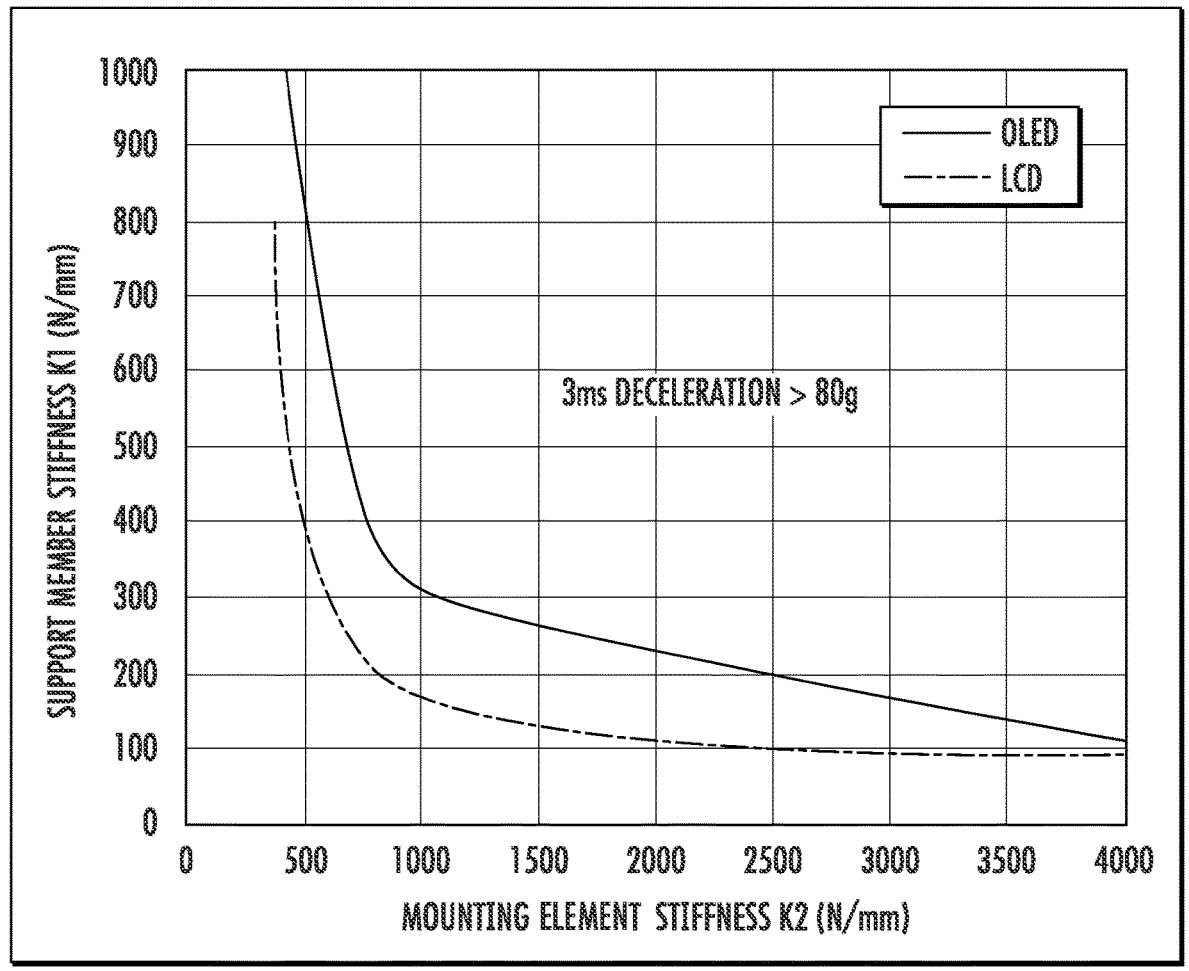
FIG. 6 depicts a graph of the design window of an OLED display module as compared to an LCD module for meeting headform impact testing standards, according to exemplary embodiments.

Using the data obtained from Table 2, the stiffness $K_1$ of the support member 26 was plotted against the stiffness $K_2$ of the mounting element 30 in the graph of FIG. 6, and a curve defining a design window for the display device 28 was developed. In particular, it was determined that an effective stiffness $K_S$ of 270 N/mm or less provide an OLED display device that passed headform impact testing. As can be seen in FIG. 6, the combinations of stiffnesses $K_1$ and $K_2$ above the curve (to the upper right) produce an effective stiffness $K_S$ of more than 270 N/mm and experience a deceleration of more than 80 g for a duration of more than 3 ms, and thus, fail the headform impact testing. The combinations of stiffnesses $K_1$ and $K_2$ below the curve (to the lower left) produce an effective stiffness $K_S$ of 270 N/mm or less and pass headform impact testing. In embodiments, the stiffness $K_1$ of the support member 26 is designed to be at least 100 N/mm to prevent significant flexing of the glass substrate 12 so as to cause breakage.

In FIG. 6, the effective stiffness curve for the LCD module 90 of FIG. 3A was also plotted. As can be seen in FIG. 6, the design window for the presently disclosed OLED display module 10 is larger than the design window for the LCD module 90.

Having described the structure and properties of the OLED display module 10, embodiments of methods for manufacturing the OLED display module are provided. In embodiments, the OLED display module 10 is manufactured through cold-forming or cold-bending. By "cold-forming" or "cold-bending," it is meant that the curved region 20 is introduced to the glass substrate 12 cover material at a temperature below the softening temperature of the glass. More particularly, cold-forming takes place at below 200° C., below 100° C., or even at room temperature.

During cold forming, pressure is applied to the glass substrate 12 to bring the glass substrate 12 into conformity with a chuck or mold. Pressure may be applied in a variety of different ways, such as vacuum pressure, a mechanical press, rollers, etc. Given the flexibility of the OLED display 24, the OLED display 24 can be bonded to the glass substrate 12 before cold-forming (i.e., when the glass substrate 12 is in a flat configuration) or after cold-forming (i.e., when the glass substrate 12 is bent over the chuck or mold). In embodiments, the support member 26 is then adhered to the OLED display 24 via adhesive layer 27. A first support surface of the support member 26 defines a curvature to which the glass substrate 12 and OLED display 24 are bent. In embodiments, pressure is maintained on the glass substrate 12 until the adhesive 27 cures (at least enough to prevent debonding of the glass substrate 12 and OLED display 24 from the support member 26). Upon curing, the glass substrate 12 and OLED display 24 maintain their respective curvatures to within 10%, more particularly to within 5%, and most particularly to within 2% of the curvature of the support member 26.

In embodiments, the mounting element 30 may be joined to a second support surface of the support member 26 that is opposite to the first support surface prior to bonding the support member to the OLED display 24 and glass substrate 12 or joined to the second support surface of the support member 26 after cold-forming is complete. Thereafter, the curved OLED display module 10 is formed, and the OLED display module 10 may be shipped and/or installed as part of a vehicle interior system.

Cold-bending provides certain advantages for assembling the OLED display modules 10 according to the present disclosure. In particular, the low temperature at which it is conducted make the process less expensive than conventional hot-forming processes. Further, the temperatures associated with hot-forming processes have been known to thermally disrupt or degrade surface treatments or create optical distortions. For this reason, surface treatments were generally applied to curved glass articles, which increased the complexity of the surface treatment application process. Because cold-forming is done at much lower temperatures than conventional hot-forming, the surface treatments can be applied while the glass substrate is in a planar configuration without the concern that the bending operation will cause thermal disruption or degradation of the surface treatment.

Figure 7:
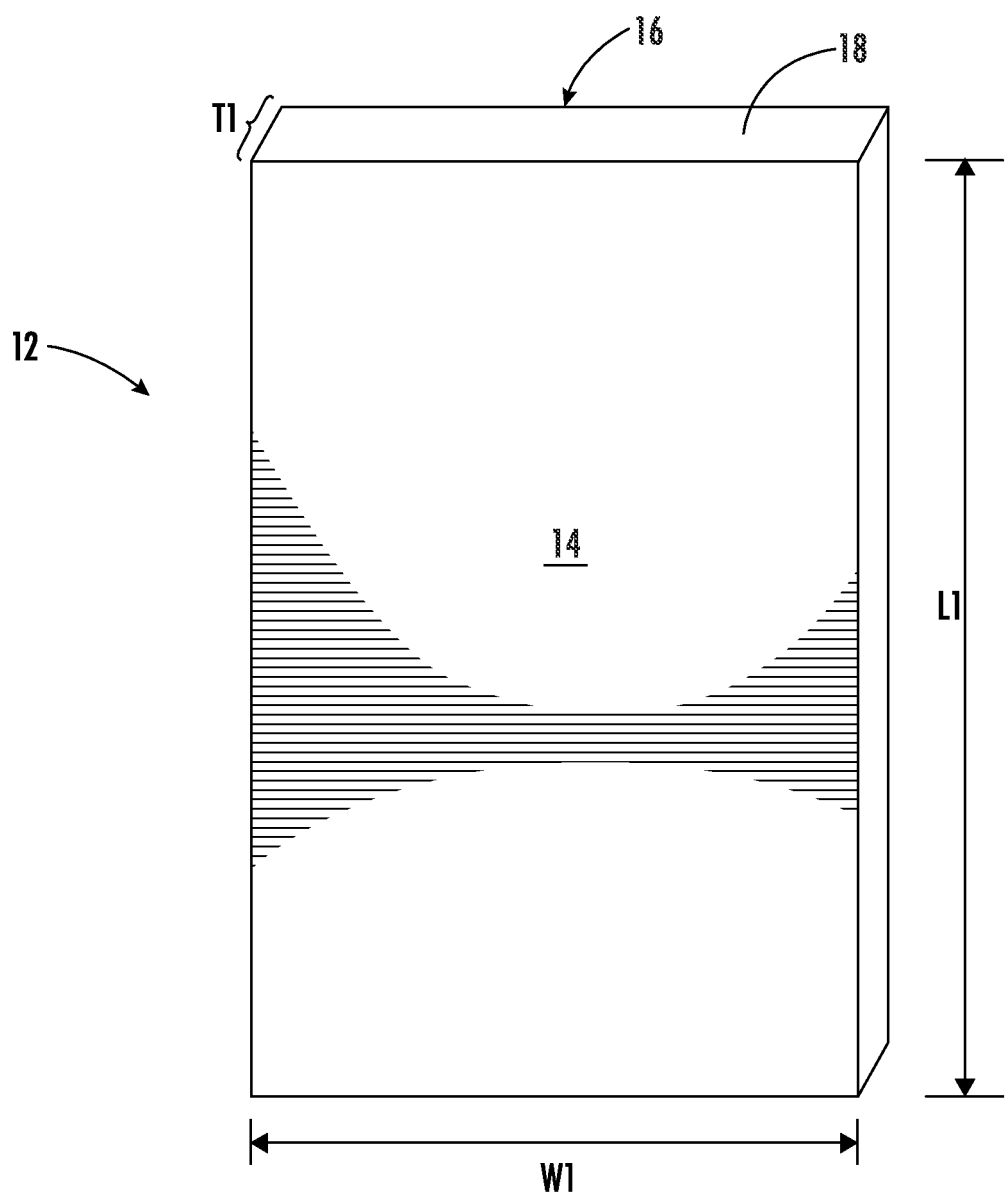
FIG. 7 depicts a glass substrate suitable for cold-forming to produce an OLED display module, according to an exemplary embodiment.

In the following paragraphs, various geometrical, mechanical, and strengthening properties of the glass substrate 12 as well as compositions of the glass substrate are provided. Referring to FIG. 7, the glass substrate 12 has a thickness T1 that is substantially constant over the width and length of the glass substrate 12 and is defined as a distance between the first major surface 14 and the second major surface 16. In various embodiments, T1 may refer to an average thickness or a maximum thickness of the glass substrate. In addition, the glass substrate 12 includes a width W1 defined as a first maximum dimension of one of the first or second major surfaces 14, 16 orthogonal to the thickness T1, and a length L1 defined as a second maximum dimension of one of the first or second major surfaces 14, 16 orthogonal to both the thickness and the width. In other embodiments, W1 and L1 may be the average width and the average length of the glass substrate 12, respectively, and in other embodiments, W1 and L1 may be the maximum width and the maximum length of the glass substrate 12, respectively (e.g., for glass substrates 14 having a variable width or length).

In various embodiments, thickness T1 is 2 mm or less. In particular, the thickness T1 is from 0.30 mm to 2.0 mm. For example, thickness T1 may be in a range from about 0.30 mm to about 2.0 mm, from about 0.40 mm to about 2.0 mm, from about 0.50 mm to about 2.0 mm, from about 0.60 mm to about 2.0 mm, from about 0.70 mm to about 2.0 mm, from about 0.80 mm to about 2.0 mm, from about 0.90 mm to about 2.0 mm, from about 1.0 mm to about 2.0 mm, from about 1.1 mm to about 2.0 mm, from about 1.2 mm to about 2.0 mm, from about 1.3 mm to about 2.0 mm, from about 1.4 mm to about 2.0 mm, from about 1.5 mm to about 2.0 mm, from about 0.30 mm to about 1.9 mm, from about 0.30 mm to about 1.8 mm, from about 0.30 mm to about 1.7 mm, from about 0.30 mm to about 1.6 mm, from about 0.30 mm to about 1.5 mm, from about 0.30 mm to about 1.4 mm, from about 0.30 mm to about 1.4 mm, from about 0.30 mm to about 1.3 mm, from about 0.30 mm to about 1.2 mm, from about 0.30 mm to about 1.1 mm, from about 0.30 mm to about 1.0 mm, from about 0.30 mm to about 0.90 mm, from about 0.30 mm to about 0.80 mm, from about 0.30 mm to about 0.70 mm, from about 0.30 mm to about 0.60 mm, or from about 0.30 mm to about 0.40 mm. In other embodiments, the T1 falls within any one of the exact numerical ranges set forth in this paragraph.

In various embodiments, width W1 is in a range from 5 cm to 250 cm, from about 10 cm to about 250 cm, from about 15 cm to about 250 cm, from about 20 cm to about 250 cm, from about 25 cm to about 250 cm, from about 30 cm to about 250 cm, from about 35 cm to about 250 cm, from about 40 cm to about 250 cm, from about 45 cm to about 250 cm, from about 50 cm to about 250 cm, from about 55 cm to about 250 cm, from about 60 cm to about 250 cm, from about 65 cm to about 250 cm, from about 70 cm to about 250 cm, from about 75 cm to about 250 cm, from about 80 cm to about 250 cm, from about 85 cm to about 250 cm, from about 90 cm to about 250 cm, from about 95 cm to about 250 cm, from about 100 cm to about 250 cm, from about 110 cm to about 250 cm, from about 120 cm to about 250 cm, from about 130 cm to about 250 cm, from about 140 cm to about 250 cm, from about 150 cm to about 250 cm, from about 5 cm to about 240 cm, from about 5 cm to about 230 cm, from about 5 cm to about 220 cm, from about 5 cm to about 210 cm, from about 5 cm to about 200 cm, from about 5 cm to about 190 cm, from about 5 cm to about 180 cm, from about 5 cm to about 170 cm, from about 5 cm to about 160 cm, from about 5 cm to about 150 cm, from about 5 cm to about 140 cm, from about 5 cm to about 130 cm, from about 5 cm to about 120 cm, from about 5 cm to about 110 cm, from about 5 cm to about 110 cm, from about 5 cm to about 100 cm, from about 5 cm to about 90 cm, from about 5 cm to about 80 cm, or from about 5 cm to about 75 cm. In other embodiments, W1 falls within any one of the exact numerical ranges set forth in this paragraph.

In various embodiments, length L1 is in a range from about 5 cm to about 1500 cm, from about 50 cm to about 1500 cm, from about 100 cm to about 1500 cm, from about 150 cm to about 1500 cm, from about 200 cm to about 1500 cm, from about 250 cm to about 1500 cm, from about 300 cm to about 1500 cm, from about 350 cm to about 1500 cm, from about 400 cm to about 1500 cm, from about 450 cm to about 1500 cm, from about 500 cm to about 1500 cm, from about 550 cm to about 1500 cm, from about 600 cm to about 1500 cm, from about 650 cm to about 1500 cm, from about 650 cm to about 1500 cm, from about 700 cm to about 1500 cm, from about 750 cm to about 1500 cm, from about 800 cm to about 1500 cm, from about 850 cm to about 1500 cm, from about 900 cm to about 1500 cm, from about 950 cm to about 1500 cm, from about 1000 cm to about 1500 cm, from about 1050 cm to about 1500 cm, from about 1100 cm to about 1500 cm, from about 1150 cm to about 1500 cm, from about 1200 cm to about 1500 cm, from about 1250 cm to about 1500 cm, from about 1500 cm, from about 1300 cm to about 1500 cm, from about 1350 cm to about 1500 cm, from about 1400 cm to about 1500 cm, or from about 1450 cm to about 1500 cm. In other embodiments, L1 falls within any one of the exact numerical ranges set forth in this paragraph.

In various embodiments, one or more radius of curvature (e.g., R shown in FIGS. 2A-2B) of glass substrate 12 is about 50 mm or greater. For example, R may be in a range from about 50 mm to about 10,000 mm, from about 60 mm to about 10,000 mm, from about 70 mm to about 10,000 mm, from about 80 mm to about 10,000 mm, from about 90 mm to about 10,000 mm, from about 100 mm to about 10,000 mm, from about 120 mm to about 10,000 mm, from about 140 mm to about 10,000 mm, from about 150 mm to about 10,000 mm, from about 160 mm to about 10,000 mm, from about 180 mm to about 10,000 mm, from about 200 mm to about 10,000 mm, from about 220 mm to about 10,000 mm, from about 240 mm to about 10,000 mm, from about 250 mm to about 10,000 mm, from about 260 mm to about 10,000 mm, from about 270 mm to about 10,000 mm, from about 280 mm to about 10,000 mm, from about 290 mm to about 10,000 mm, from about 300 mm to about 10,000 mm, from about 350 mm to about 10,000 mm, from about 400 mm to about 10,000 mm, from about 450 mm to about 10,000 mm, from about 500 mm to about 10,000 mm, from about 550 mm to about 10,000 mm, from about 600 mm to about 10,000 mm, from about 650 mm to about 10,000 mm, from about 700 mm to about 10,000 mm, from about 750 mm to about 10,000 mm, from about 800 mm to about 10,000 mm, from about 900 mm to about 10,000 mm, from about 950 mm to about 10,000 mm, from about 1000 mm to about 10,000 mm, from about 1250 mm to about 10,000 mm, from about 50 mm to about 1400 mm, from about 50 mm to about 1300 mm, from about 50 mm to about 1200 mm, from about 50 mm to about 1100 mm, from about 50 mm to about 1000 mm, from about 50 mm to about 950 mm, from about 50 mm to about 900 mm, from about 50 mm to about 850 mm, from about 50 mm to about 800 mm, from about 50 mm to about 750 mm, from about 50 mm to about 700 mm, from about 50 mm to about 650 mm, from about 50 mm to about 600 mm, from about 50 mm to about 550 mm, from about 50 mm to about 500 mm, from about 50 mm to about 450 mm, from about 50 mm to about 400 mm, from about 50 mm to about 350 mm, from about 50 mm to about 300 mm, or from about 50 mm to about 250 mm. In other embodiments, R falls within any one of the exact numerical ranges set forth in this paragraph.

The various embodiments of the vehicle interior system may be incorporated into vehicles such as trains, automobiles (e.g., cars, trucks, buses and the like), sea craft (boats, ships, submarines, and the like), and aircraft (e.g., drones, airplanes, jets, helicopters and the like).

Strengthened Glass Properties

The glass substrate 12 used in the OLED display device may be strengthened. In one or more embodiments, glass substrate 12 may be strengthened to include compressive stress that extends from a surface to a depth of compression (DOC). The compressive stress regions are balanced by a central portion exhibiting a tensile stress. At the DOC, the stress crosses from a positive (compressive) stress to a negative (tensile) stress.

In various embodiments, glass substrate 12 may be strengthened mechanically by utilizing a mismatch of the coefficient of thermal expansion between portions of the article to create a compressive stress region and a central region exhibiting a tensile stress. In some embodiments, the glass substrate may be strengthened thermally by heating the glass to a temperature above the glass transition point and then rapidly quenching.

In various embodiments, glass substrate 12 may be chemically strengthened by ion exchange. In the ion exchange process, ions at or near the surface of the glass substrate are replaced by—or exchanged with—larger ions having the same valence or oxidation state. In those embodiments in which the glass substrate comprises an alkali aluminosilicate glass, ions in the surface layer of the article and the larger ions are monovalent alkali metal cations, such as $Li^+$, $Na^+$, $K^+$, $Rb^+$, and $Cs^+$. Alternatively, monovalent cations in the surface layer may be replaced with monovalent cations other than alkali metal cations, such as $Ag^+$ or the like. In such embodiments, the monovalent ions (or cations) exchanged into the glass substrate generate a stress.

Ion exchange processes are typically carried out by immersing a glass substrate in a molten salt bath (or two or more molten salt baths) containing the larger ions to be exchanged with the smaller ions in the glass substrate. It should be noted that aqueous salt baths may also be utilized. In addition, the composition of the bath(s) may include more than one type of larger ions (e.g., Na+ and K+) or a single larger ion. It will be appreciated by those skilled in the art that parameters for the ion exchange process, including, but not limited to, bath composition and temperature, immersion time, the number of immersions of the glass substrate in a salt bath (or baths), use of multiple salt baths, additional steps such as annealing, washing, and the like, are generally determined by the composition of the glass substrate (including the structure of the article and any crystalline phases present) and the desired DOC and CS of the glass substrate that results from strengthening. Exemplary molten bath compositions may include nitrates, sulfates, and chlorides of the larger alkali metal ion. Typical nitrates include $KNO_3$, $NaNO_3$, $LiNO_3$, $NaSO_4$ and combinations thereof. The temperature of the molten salt bath typically is in a range from about 380° C. up to about 450° C., while immersion times range from about 15 minutes up to about 100 hours depending on glass substrate thickness, bath temperature and glass (or monovalent ion) diffusivity. However, temperatures and immersion times different from those described above may also be used.

In one or more embodiments, the glass substrates may be immersed in a molten salt bath of 100% $NaNO_3$, 100% $KNO_3$, or a combination of $NaNO_3$ and $KNO_3$ having a temperature from about 370° C. to about 480° C. In some embodiments, the glass substrate may be immersed in a molten mixed salt bath including from about 5% to about 90% $KNO_3$ and from about 10% to about 95% $NaNO_3$. In one or more embodiments, the glass substrate may be immersed in a second bath, after immersion in a first bath. The first and second baths may have different compositions and/or temperatures from one another. The immersion times in the first and second baths may vary. For example, immersion in the first bath may be longer than the immersion in the second bath.

In one or more embodiments, the glass substrate may be immersed in a molten, mixed salt bath including $NaNO_3$ and $KNO_3$ (e.g., 49%/51%, 50%/50%, 51%/49%) having a temperature less than about 420° C. (e.g., about 400° C. or about 380° C.), for less than about 5 hours, or even about 4 hours or less.

Ion exchange conditions can be tailored to provide a "spike" or to increase the slope of the stress profile at or near the surface of the resulting glass substrate. The spike may result in a greater surface CS value. This spike can be achieved by a single bath or multiple baths, with the bath(s) having a single composition or mixed composition, due to the unique properties of the glass compositions used in the glass substrates described herein.

In one or more embodiments, where more than one monovalent ion is exchanged into the glass substrate, the different monovalent ions may exchange to different depths within the glass substrate (and generate different magnitudes stresses within the glass substrate at different depths). The resulting relative depths of the stress-generating ions can be determined and cause different characteristics of the stress profile.

CS is measured using those means known in the art, such as by surface stress meter (FSM) using commercially available instruments such as the FSM-6000, manufactured by Orihara Industrial Co., Ltd. (Japan). Surface stress measurements rely upon the accurate measurement of the stress optical coefficient (SOC), which is related to the birefringence of the glass. SOC in turn is measured by those methods that are known in the art, such as fiber and four point bend methods, both of which are described in ASTM standard C770-98 (2013), entitled "Standard Test Method for Measurement of Glass Stress-Optical Coefficient," the contents of which are incorporated herein by reference in their entirety, and a bulk cylinder method. As used herein CS may be the "maximum compressive stress" which is the highest compressive stress value measured within the compressive stress layer. In some embodiments, the maximum compressive stress is located at the surface of the glass substrate. In other embodiments, the maximum compressive stress may occur at a depth below the surface, giving the compressive profile the appearance of a "buried peak."

DOC may be measured by FSM or by a scattered light polariscope (SCALP) (such as the SCALP-04 scattered light polariscope available from Glasstress Ltd., located in Tallinn Estonia), depending on the strengthening method and conditions. When the glass substrate is chemically strengthened by an ion exchange treatment, FSM or SCALP may be used depending on which ion is exchanged into the glass substrate. Where the stress in the glass substrate is generated by exchanging potassium ions into the glass substrate, FSM is used to measure DOC. Where the stress is generated by exchanging sodium ions into the glass substrate, SCALP is used to measure DOC. Where the stress in the glass substrate is generated by exchanging both potassium and sodium ions into the glass, the DOC is measured by SCALP, since it is believed the exchange depth of sodium indicates the DOC and the exchange depth of potassium ions indicates a change in the magnitude of the compressive stress (but not the change in stress from compressive to tensile); the exchange depth of potassium ions in such glass substrates is measured by FSM. Central tension or CT is the maximum tensile stress and is measured by SCALP.

In one or more embodiments, the glass substrate may be strengthened to exhibit a DOC that is described as a fraction of the thickness T1 of the glass substrate 12 (as described herein). For example, in one or more embodiments, the DOC may be equal to or greater than about 0.05T1, equal to or greater than about 0.1T1, equal to or greater than about 0.11T1, equal to or greater than about 0.12T1, equal to or greater than about 0.13T1, equal to or greater than about 0.14T1, equal to or greater than about 0.15T1, equal to or greater than about 0.16T1, equal to or greater than about 0.17T1, equal to or greater than about 0.18T1, equal to or greater than about 0.19T1, equal to or greater than about 0.2T1, equal to or greater than about 0.21T1. In some embodiments, the DOC may be in a range from about 0.08T1 to about 0.25T1, from about 0.09T1 to about 0.25T1, from about 0.18T1 to about 0.25T1, from about 0.11T1 to about 0.25T1, from about 0.12T1 to about 0.25T1, from about 0.13T1 to about 0.25T1, from about 0.14T1 to about 0.25T1, from about 0.15T1 to about 0.25T1, from about 0.08T1 to about 0.24T1, from about 0.08T1 to about 0.23T1, from about 0.08T1 to about 0.22T1, from about 0.08T1 to about 0.21T1, from about 0.08T1 to about 0.2T1, from about 0.08T1 to about 0.19T1, from about 0.08T1 to about 0.18T1, from about 0.08T1 to about 0.17T1, from about 0.08T1 to about 0.16T1, or from about 0.08T1 to about 0.15T1. In some instances, the DOC may be about 20 μm or less. In one or more embodiments, the DOC may be about 40 μm or greater (e.g., from about 40 μm to about 300 μm, from about 50 μm to about 300 μm, from about 60 μm to about 300 μm, from about 70 μm to about 300 μm, from about 80 μm to about 300 μm, from about 90 μm to about 300 μm, from about 100 μm to about 300 μm, from about 110 μm to about 300 μm, from about 120 μm to about 300 μm, from about 140 μm to about 300 μm, from about 150 μm to about 300 μm, from about 40 μm to about 290 μm, from about 40 μm to about 280 μm, from about 40 μm to about 260 μm, from about 40 μm to about 250 μm, from about 40 μm to about 240 μm, from about 40 μm to about 230 μm, from about 40 μm to about 220 μm, from about 40 μm to about 210 μm, from about 40 μm to about 200 μm, from about 40 μm to about 180 μm, from about 40 μm to about 160 μm, from about 40 μm to about 150 μm, from about 40 μm to about 140 μm, from about 40 μm to about 130 μm, from about 40 μm to about 120 μm, from about 40 μm to about 110 μm, or from about 40 μm to about 100 μm. In other embodiments, DOC falls within any one of the exact numerical ranges set forth in this paragraph.

In one or more embodiments, the strengthened glass substrate may have a CS (which may be found at the surface or a depth within the glass substrate) of about 200 MPa or greater, 300 MPa or greater, 400 MPa or greater, about 500 MPa or greater, about 600 MPa or greater, about 700 MPa or greater, about 800 MPa or greater, about 900 MPa or greater, about 930 MPa or greater, about 1000 MPa or greater, or about 1050 MPa or greater.

In one or more embodiments, the strengthened glass substrate may have a maximum tensile stress or central tension (CT) of about 20 MPa or greater, about 30 MPa or greater, about 40 MPa or greater, about 45 MPa or greater, about 50 MPa or greater, about 60 MPa or greater, about 70 MPa or greater, about 75 MPa or greater, about 80 MPa or greater, or about 85 MPa or greater. In some embodiments, the maximum tensile stress or central tension (CT) may be in a range from about 40 MPa to about 100 MPa. In other embodiments, CS falls within the exact numerical ranges set forth in this paragraph.

Glass Compositions

Suitable glass compositions for use in glass substrate 12 include soda lime glass, aluminosilicate glass, borosilicate glass, boroaluminosilicate glass, alkali-containing aluminosilicate glass, alkali-containing borosilicate glass, and alkali-containing boroaluminosilicate glass.

Unless otherwise specified, the glass compositions disclosed herein are described in mole percent (mol %) as analyzed on an oxide basis.

In one or more embodiments, the glass composition may include $SiO_2$ in an amount in a range from about 66 mol % to about 80 mol %, from about 67 mol % to about 80 mol %, from about 68 mol % to about 80 mol %, from about 69 mol % to about 80 mol %, from about 70 mol % to about 80 mol %, from about 72 mol % to about 80 mol %, from about 65 mol % to about 78 mol %, from about 65 mol % to about 76 mol %, from about 65 mol % to about 75 mol %, from about 65 mol % to about 74 mol %, from about 65 mol % to about 72 mol %, or from about 65 mol % to about 70 mol %, and all ranges and sub-ranges therebetween.

In one or more embodiments, the glass composition includes $Al_2O_3$ in an amount greater than about 4 mol %, or greater than about 5 mol %. In one or more embodiments, the glass composition includes $Al_2O_3$ in a range from greater than about 7 mol % to about 15 mol %, from greater than about 7 mol % to about 14 mol %, from about 7 mol % to about 13 mol %, from about 4 mol % to about 12 mol %, from about 7 mol % to about 11 mol %, from about 8 mol % to about 15 mol %, from about 9 mol % to about 15 mol %, from about 10 mol % to about 15 mol %, from about 11 mol % to about 15 mol %, or from about 12 mol % to about 15 mol %, and all ranges and sub-ranges therebetween. In one or more embodiments, the upper limit of $Al_2O_3$ may be about 14 mol %, 14.2 mol %, 14.4 mol %, 14.6 mol %, or 14.8 mol %.

In one or more embodiments, the glass article is described as an aluminosilicate glass article or including an aluminosilicate glass composition. In such embodiments, the glass composition or article formed therefrom includes $SiO_2$ and $Al_2O_3$ and is not a soda lime silicate glass. In this regard, the glass composition or article formed therefrom includes $Al_2O_3$ in an amount of about 2 mol % or greater, 2.25 mol % or greater, 2.5 mol % or greater, about 2.75 mol % or greater, about 3 mol % or greater.

In one or more embodiments, the glass composition comprises $B_2O_3$ (e.g., about 0.01 mol % or greater). In one or more embodiments, the glass composition comprises $B_2O_3$ in an amount in a range from about 0 mol % to about 5 mol %, from about 0 mol % to about 4 mol %, from about 0 mol % to about 3 mol %, from about 0 mol % to about 2 mol %, from about 0 mol % to about 1 mol %, from about 0 mol % to about 0.5 mol %, from about 0.1 mol % to about 5 mol %, from about 0.1 mol % to about 4 mol %, from about 0.1 mol % to about 3 mol %, from about 0.1 mol % to about 2 mol %, from about 0.1 mol % to about 1 mol %, from about 0.1 mol % to about 0.5 mol %, and all ranges and sub-ranges therebetween. In one or more embodiments, the glass composition is substantially free of $B_2O_3$.

As used herein, the phrase "substantially free" with respect to the components of the composition means that the component is not actively or intentionally added to the composition during initial batching, but may be present as an impurity in an amount less than about 0.001 mol %.

In one or more embodiments, the glass composition optionally comprises $P_2O_5$ (e.g., about 0.01 mol % or greater). In one or more embodiments, the glass composition comprises a non-zero amount of $P_2O_5$ up to and including 2 mol %, 1.5 mol %, 1 mol %, or 0.5 mol %. In one or more embodiments, the glass composition is substantially free of $P_2O_5$.

In one or more embodiments, the glass composition may include a total amount of $R_2O$ (which is the total amount of alkali metal oxide such as $Li_2O$, $Na_2O$, $K_2O$, $Rb_2O$, and $Cs_2O$) that is greater than or equal to about 8 mol %, greater than or equal to about 10 mol %, or greater than or equal to about 12 mol %. In some embodiments, the glass composition includes a total amount of $R_2O$ in a range from about 8 mol % to about 20 mol %, from about 8 mol % to about 18 mol %, from about 8 mol % to about 16 mol %, from about 8 mol % to about 14 mol %, from about 8 mol % to about 12 mol %, from about 9 mol % to about 20 mol %, from about 10 mol % to about 20 mol %, from about 11 mol % to about 20 mol %, from about 12 mol % to about 20 mol %, from about 13 mol % to about 20 mol %, from about 10 mol % to about 14 mol %, or from 11 mol % to about 13 mol %, and all ranges and sub-ranges therebetween. In one or more embodiments, the glass composition may be substantially free of $Rb_2O$, $Cs_2O$ or both $Rb_2O$ and $Cs_2O$. In one or more embodiments, the $R_2O$ may include the total amount of $Li_2O$, $Na_2O$ and $K_2O$ only. In one or more embodiments, the glass composition may comprise at least one alkali metal oxide selected from $Li_2O$, $Na_2O$ and $K_2O$, wherein the alkali metal oxide is present in an amount greater than about 8 mol % or greater.

In one or more embodiments, the glass composition comprises $Na_2O$ in an amount greater than or equal to about 8 mol %, greater than or equal to about 10 mol %, or greater than or equal to about 12 mol %. In one or more embodiments, the composition includes $Na_2O$ in a range from about from about 8 mol % to about 20 mol %, from about 8 mol % to about 18 mol %, from about 8 mol % to about 16 mol %, from about 8 mol % to about 14 mol %, from about 8 mol % to about 12 mol %, from about 9 mol % to about 20 mol %, from about 10 mol % to about 20 mol %, from about 11 mol % to about 20 mol %, from about 12 mol % to about 20 mol %, from about 13 mol % to about 20 mol %, from about 10 mol % to about 14 mol %, or from 11 mol % to about 16 mol %, and all ranges and sub-ranges therebetween.

In one or more embodiments, the glass composition includes less than about 4 mol % $K_2O$, less than about 3 mol % $K_2O$, or less than about 1 mol % $K_2O$. In some instances, the glass composition may include $K_2O$ in an amount in a range from about 0 mol % to about 4 mol %, from about 0 mol % to about 3.5 mol %, from about 0 mol % to about 3 mol %, from about 0 mol % to about 2.5 mol %, from about 0 mol % to about 2 mol %, from about 0 mol % to about 1.5 mol %, from about 0 mol % to about 1 mol %, from about 0 mol % to about 0.5 mol %, from about 0 mol % to about 0.2 mol %, from about 0 mol % to about 0.1 mol %, from about 0.5 mol % to about 4 mol %, from about 0.5 mol % to about 3.5 mol %, from about 0.5 mol % to about 3 mol %, from about 0.5 mol % to about 2.5 mol %, from about 0.5 mol % to about 2 mol %, from about 0.5 mol % to about 1.5 mol %, or from about 0.5 mol % to about 1 mol %, and all ranges and sub-ranges therebetween. In one or more embodiments, the glass composition may be substantially free of $K_2O$.

In one or more embodiments, the glass composition is substantially free of $Li_2O$.

In one or more embodiments, the amount of $Na_2O$ in the composition may be greater than the amount of $Li_2O$. In some instances, the amount of $Na_2O$ may be greater than the combined amount of $Li_2O$ and $K_2O$. In one or more alternative embodiments, the amount of $Li_2O$ in the composition may be greater than the amount of $Na_2O$ or the combined amount of $Na_2O$ and $K_2O$.

In one or more embodiments, the glass composition may include a total amount of RO (which is the total amount of alkaline earth metal oxide such as CaO, MgO, BaO, ZnO and SrO) in a range from about 0 mol % to about 2 mol %. In some embodiments, the glass composition includes a non-zero amount of RO up to about 2 mol %. In one or more embodiments, the glass composition comprises RO in an amount from about 0 mol % to about 1.8 mol %, from about 0 mol % to about 1.6 mol %, from about 0 mol % to about 1.5 mol %, from about 0 mol % to about 1.4 mol %, from about 0 mol % to about 1.2 mol %, from about 0 mol % to about 1 mol %, from about 0 mol % to about 0.8 mol %, from about 0 mol % to about 0.5 mol %, and all ranges and sub-ranges therebetween.

In one or more embodiments, the glass composition includes CaO in an amount less than about 1 mol %, less than about 0.8 mol %, or less than about 0.5 mol %. In one or more embodiments, the glass composition is substantially free of CaO.

In some embodiments, the glass composition comprises MgO in an amount from about 0 mol % to about 7 mol %, from about 0 mol % to about 6 mol %, from about 0 mol % to about 5 mol %, from about 0 mol % to about 4 mol %, from about 0.1 mol % to about 7 mol %, from about 0.1 mol % to about 6 mol %, from about 0.1 mol % to about 5 mol %, from about 0.1 mol % to about 4 mol %, from about 1 mol % to about 7 mol %, from about 2 mol % to about 6 mol %, or from about 3 mol % to about 6 mol %, and all ranges and sub-ranges therebetween.

In one or more embodiments, the glass composition comprises $ZrO_2$ in an amount equal to or less than about 0.2 mol %, less than about 0.18 mol %, less than about 0.16 mol %, less than about 0.15 mol %, less than about 0.14 mol %, less than about 0.12 mol %. In one or more embodiments, the glass composition comprises $ZrO_2$ in a range from about 0.01 mol % to about 0.2 mol %, from about 0.01 mol % to about 0.18 mol %, from about 0.01 mol % to about 0.16 mol %, from about 0.01 mol % to about 0.15 mol %, from about 0.01 mol % to about 0.14 mol %, from about 0.01 mol % to about 0.12 mol %, or from about 0.01 mol % to about 0.10 mol %, and all ranges and sub-ranges therebetween.

In one or more embodiments, the glass composition comprises $SnO_2$ in an amount equal to or less than about 0.2 mol %, less than about 0.18 mol %, less than about 0.16 mol %, less than about 0.15 mol %, less than about 0.14 mol %, less than about 0.12 mol %. In one or more embodiments, the glass composition comprises SnO2 in a range from about 0.01 mol % to about 0.2 mol %, from about 0.01 mol % to about 0.18 mol %, from about 0.01 mol % to about 0.16 mol %, from about 0.01 mol % to about 0.15 mol %, from about 0.01 mol % to about 0.14 mol %, from about 0.01 mol % to about 0.12 mol %, or from about 0.01 mol % to about 0.10 mol %, and all ranges and sub-ranges therebetween.

In one or more embodiments, the glass composition may include an oxide that imparts a color or tint to the glass articles. In some embodiments, the glass composition includes an oxide that prevents discoloration of the glass article when the glass article is exposed to ultraviolet radiation. Examples of such oxides include, without limitation oxides of: Ti, V, Cr, Mn, Fe, Co, Ni, Cu, Ce, W, and Mo.

In one or more embodiments, the glass composition includes Fe expressed as $Fe_2O_3$, wherein Fe is present in an amount up to (and including) about 1 mol %. In some embodiments, the glass composition is substantially free of Fe. In one or more embodiments, the glass composition comprises $Fe_2O_3$ in an amount equal to or less than about 0.2 mol %, less than about 0.18 mol %, less than about 0.16 mol %, less than about 0.15 mol %, less than about 0.14 mol %, less than about 0.12 mol %. In one or more embodiments, the glass composition comprises $Fe_2O_3$ in a range from about 0.01 mol % to about 0.2 mol %, from about 0.01 mol % to about 0.18 mol %, from about 0.01 mol % to about 0.16 mol %, from about 0.01 mol % to about 0.15 mol %, from about 0.01 mol % to about 0.14 mol %, from about 0.01 mol % to about 0.12 mol %, or from about 0.01 mol % to about 0.10 mol %, and all ranges and sub-ranges therebetween.

Where the glass composition includes $TiO_2$, $TiO_2$ may be present in an amount of about 5 mol % or less, about 2.5 mol % or less, about 2 mol % or less or about 1 mol % or less. In one or more embodiments, the glass composition may be substantially free of $TiO_2$.

An exemplary glass composition includes $SiO_2$ in an amount in a range from about 65 mol % to about 75 mol %, $Al_2O_3$ in an amount in a range from about 8 mol % to about 14 mol %, $Na_2O$ in an amount in a range from about 12 mol % to about 17 mol %, $K_2O$ in an amount in a range of about 0 mol % to about 0.2 mol %, and MgO in an amount in a range from about 1. 5 mol % to about 6 mol %. Optionally, $SnO_2$ may be included in the amounts otherwise disclosed herein. It should be understood, that while the preceding glass composition paragraphs express approximate ranges, in other embodiments, glass substrate 12 may be made from any glass composition falling with any one of the exact numerical ranges discussed above.

Aspect (1) of this disclosure pertains to a display device for a vehicle interior system, comprising: a display module, comprising a glass substrate comprising a first major surface and a second major surface, the second major surface being opposite to the first major surface; an organic light emitting diode (OLED) display disposed on the second major surface of the glass substrate; and a support member comprising a first support surface and a second support surface, the second support surface being opposite to the first support surface, wherein the OLED display is disposed on the first support surface; and a mounting element disposed on the second support surface of the support member; wherein the support member comprises a first stiffness and the mounting element comprises a second stiffness; wherein the first stiffness is at least 100 N/mm; and wherein an effective stiffness of the first stiffness and the second stiffness is no more than 270 N/mm.

Aspect (2) of this disclosure pertains to the display device of Aspect (1), wherein the first stiffness is no more than 1000 N/mm.

Aspect (3) of this disclosure pertains to the display device of Aspect (1) or Aspect (2), wherein the second stiffness is from 200 N/mm to 4500 N/mm.

Aspect (4) of this disclosure pertains to the display device of any one of Aspects (1) through (3), wherein the display module comprises a flexural rigidity of from 10 Nm to 500 Nm.

Aspect (5) of this disclosure pertains to the display device of Aspect (4), wherein the support member accounts for at least 80% of the flexural rigidity of the display module.

Aspect (6) of this disclosure pertains to the display device of Aspects (4) or Aspect (5), wherein the OLED display accounts for 5% or less of the flexural rigidity of the display module.

Aspect (7) of this disclosure pertains to the display device of any one of Aspects (4) through (6), wherein the glass substrate accounts for 20% or less of the flexural rigidity of the display module.

Aspect (8) of this disclosure pertains to the display device of any one of Aspects (1) through (7), wherein the OLED display comprises a display thickness of 1 mm or less.

Aspect (9) of this disclosure pertains to the display device of any one of Aspects (1) through (8), wherein the glass substrate comprises a glass thickness between the first major surface and the second major surface of from 0.3 mm to 2.0 mm.

Aspect (10) of this disclosure pertains to the display device of any one of Aspects (1) through (9), wherein the mounting element comprises at least one bracket configured for attachment to a vehicle interior base.

Aspect (11) of this disclosure pertains to the display device of Aspect (10), wherein each of the at least one bracket is C-shaped having a first arm disposed on the second support surface, a second arm configured for attachment to the vehicle interior base, and a cross-member connecting the first arm to the second arm.

Aspect (12) of this disclosure pertains to the display device of any one of Aspects (1) through (11), wherein, when the display device is subjected to headform impact testing according to FMVSS 201, the headform does not exceed 80 g deceleration continuously for more than 3 ms.

Aspect (13) of this disclosure pertains to the display device of any one of Aspects (1) through (12), wherein the first support surface of the support member comprises a curvature and wherein the glass substrate is cold-formed into conformity with the curvature of the support member.

Aspect (14) of this disclosure pertains to the display device of Aspect (13), wherein the OLED display is cold-formed into conformity with the curvature of the support member.

Aspect (15) of this disclosure pertains to a display device for a vehicle interior system, comprising: a display module comprising a flexural rigidity of 10 Nm to 500 Nm, the display module comprising: a glass substrate comprising a first major surface and a second major surface, the second major surface being opposite to the first major surface; an organic light emitting diode (OLED) display disposed on the second major surface of the glass substrate; and a support member comprising a first support surface and a second support surface, the second support surface being opposite to the first support surface, wherein the OLED display is disposed on the first support surface; and a mounting element disposed on the second support surface of the support member; wherein, when the display device is subjected to headform impact testing according to FMVSS 201, the headform does not exceed 80 g deceleration continuously for more than 3 ms.

Aspect (16) of this disclosure pertains to the display device of Aspect (15), wherein the support member comprises a first stiffness and the mounting element comprises a second stiffness and wherein the first stiffness is at least 100 N/mm.

Aspect (17) of this disclosure pertains to the display device of Aspect (16), wherein an effective stiffness of the first stiffness and the second stiffness is no more than 270 N/mm.

Aspect (18) of this disclosure pertains to the display device of Aspect (16) or Aspect (17), wherein the first stiffness is no more than 1000 N/mm.

Aspect (19) of this disclosure pertains to the display device of any one of Aspects (16) through (18), wherein the second stiffness is from 200 N/mm to 4500 N/mm.

Aspect (20) of this disclosure pertains to the display device of any one of Aspects (15) through (19), wherein the support member accounts for at least 80% of the flexural rigidity of the display module.

Aspect (21) of this disclosure pertains to the display device of Aspect (20), wherein the OLED display accounts for 5% or less of the flexural rigidity of the display module.

Aspect (22) of this disclosure pertains to the display device of Aspect (20) or Aspect (21), wherein the glass substrate accounts for 20% or less of the flexural rigidity of the display module.

Aspect (23) of this disclosure pertains to a method of manufacturing a display device, comprising the steps of: adhering an organic light emitting diode (OLED) display to a first support surface of a support member; wherein a mounting element is attached to a second support surface of the support member, the second support surface being opposite to the first support surface; wherein the OLED display is adhered to a glass substrate such that the OLED display is disposed between the glass substrate and the support member; wherein the support member and the mounting element comprises an effective stiffness ($K_S$) of 270 N/mm or less.

Aspect (24) of this disclosure pertains to the method of Aspect (23), wherein the first support surface comprises a first radius of curvature and wherein the method further comprises the steps of: bending the glass substrate over a curved surface having a second radius of curvature, wherein bending is performed at a temperature of 200° C. or less and wherein the second radius of curvature matches the first radius of curvature to within in 10%; adhering the OLED display to the glass substrate prior to the step of adhering the OLED display to the first support surface of the support member.

Aspect (25) of this disclosure pertains to the method of Aspect (23) or Aspect (24), wherein the support member comprises a first stiffness ($K_1$) of 100 N/mm to 1000 N/mm.

Aspect (26) of this disclosure pertains to the method of Aspect (25), wherein the mounting element comprises a second stiffness ($K_2$) of from 200 N/mm to 4500 N/mm.

Aspect (27) of this disclosure pertains to the method of Aspect (26), wherein the effective stiffness ($K_S$) is equal to $$\frac{K_1 K_2}{K_1 + K_2}.$$

Aspect (28) of this disclosure pertains to the method of any one of Aspects (23) through (27), wherein the glass substrate, the OLED display, and the support member comprise a flexural rigidity of from 10 Nm to 500 Nm.

Aspect (29) of this disclosure pertains to the method of Aspect (28), wherein the support member accounts for at least 80% of the flexural rigidity.

Aspect (30) of this disclosure pertains to the method of Aspect (29), wherein the OLED display accounts for 5% or less of the flexural rigidity.

Aspect (31) of this disclosure pertains to the method of Aspect (30), wherein the glass substrate accounts for 20% or less of the flexural rigidity.

Aspect (32) of this disclosure pertains to the method of any one of Aspects (23) through (31), wherein, when the display device is subjected to headform impact testing according to FMVSS 201, the headform does not exceed 80 g deceleration continuously for more than 3 ms.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that any particular order be inferred. In addition, as used herein, the article "a" is intended to include one or more than one component or element, and is not intended to be construed as meaning only one.

It will be apparent to those skilled in the art that various modifications and variations can be made without departing from the spirit or scope of the disclosed embodiments. Since modifications, combinations, sub-combinations and variations of the disclosed embodiments incorporating the spirit and substance of the embodiments may occur to persons skilled in the art, the disclosed embodiments should be construed to include everything within the scope of the appended claims and their equivalents.

What is claimed is:

1. A display device for a vehicle interior system, comprising:
a display module, comprising:
a glass substrate comprising a first major surface and a second major surface, the second major surface being opposite to the first major surface;
an organic light emitting diode (OLED) display disposed on the second major surface of the glass substrate; and
a support member comprising a first support surface and a second support surface, the second support surface being opposite to the first support surface, wherein the OLED display is disposed on the first support surface; and
a mounting element disposed on the second support surface of the support member;
wherein the support member comprises a first stiffness and the mounting element comprises a second stiffness;
wherein the first stiffness is at least 100 N/mm; and
wherein an effective stiffness of the first stiffness and the second stiffness is no more than 270 N/mm.

2. The display device of claim 1, wherein the first stiffness is no more than 1000 N/mm.

3. The display device of claim 1, wherein the second stiffness is from 200 N/mm to 4500 N/mm.

4. The display device according to claim 1, wherein the display module comprises a flexural rigidity of from 10 Nm to 500 Nm.

5. The display device according to claim 4, wherein the support member accounts for at least 80% of the flexural rigidity of the display module.

6. The display device according to claim 4, wherein the OLED display accounts for 5% or less of the flexural rigidity of the display module.

7. The display device according to claim 4, wherein the glass substrate accounts for 20% or less of the flexural rigidity of the display module.

8. The display device according to claim 1, wherein the OLED display comprises a display thickness of 1 mm or less and the glass substrate comprises a glass thickness between the first major surface and the second major surface of from 0.3 mm to 2.0 mm.

9. The display device according to claim 1, wherein the mounting element comprises at least one bracket configured for attachment to a vehicle interior base.

10. The display device according to claim 9, wherein each of the at least one bracket is C-shaped having a first arm disposed on the second support surface, a second arm configured for attachment to the vehicle interior base, and a cross-member connecting the first arm to the second arm.

11. The display device according to claim 1, wherein, when the display device is subjected to headform impact testing according to FMVSS 201, the headform does not exceed 80 g deceleration continuously for more than 3 ms.

12. The display device according to claim 1, wherein the first support surface of the support member comprises a curvature and wherein the glass substrate is cold-formed into conformity with the curvature of the support member, wherein the OLED display is cold-formed into conformity with the curvature of the support member.

13. A display device for a vehicle interior system, comprising:
a display module comprising a flexural rigidity of 10 Nm to 500 Nm, the display module comprising:
a glass substrate comprising a first major surface and a second major surface, the second major surface being opposite to the first major surface;
an organic light emitting diode (OLED) display disposed on the second major surface of the glass substrate; and
a support member comprising a first support surface and a second support surface, the second support surface being opposite to the first support surface, wherein the OLED display is disposed on the first support surface; and
a mounting element disposed on the second support surface of the support member;
wherein, when the display device is subjected to headform impact testing according to FMVSS 201, the headform does not exceed 80 g deceleration continuously for more than 3 ms.

14. The display device according to claim 13, wherein the support member comprises a first stiffness and the mounting element comprises a second stiffness and wherein the first stiffness is at least 100 N/mm.

15. The display device according to claim 14, wherein an effective stiffness of the first stiffness and the second stiffness is no more than 270 N/mm.

16. The display device of claim 14, wherein the first stiffness is no more than 1000 N/mm, wherein the second stiffness is from 200 N/mm to 4500 N/mm.

17. The display device according to claim 16, wherein the support member accounts for at least 80% of the flexural rigidity of the display module, wherein the OLED display accounts for 5% or less of the flexural rigidity of the display module, wherein the glass substrate accounts for 20% or less of the flexural rigidity of the display module.

18. A method of manufacturing a display device, comprising the steps of:
adhering an organic light emitting diode (OLED) display to a first support surface of a support member;
wherein a mounting element is attached to a second support surface of the support member, the second support surface being opposite to the first support surface;
wherein the OLED display is adhered to a glass substrate such that the OLED display is disposed between the glass substrate and the support member;
wherein the support member and the mounting element comprises an effective stiffness ($K_S$) of 270 N/mm or less.

19. The method of claim 18, wherein the first support surface comprises a first radius of curvature and wherein the method further comprises the steps of:
bending the glass substrate over a curved surface having a second radius of curvature, wherein bending is performed at a temperature of 200° C. or less and wherein the second radius of curvature matches the first radius of curvature to within in 10%;
adhering the OLED display to the glass substrate prior to the step of adhering the OLED display to the first support surface of the support member.

20. The method of claim 18, wherein the glass substrate, the OLED display, and the support member comprise a flexural rigidity of from 10 Nm to 500 Nm, wherein the support member accounts for at least 80% of the flexural rigidity, wherein the OLED display accounts for 5% or less of the flexural rigidity, wherein the glass substrate accounts for 20% or less of the flexural rigidity.

\* \* \* \* \*